United States Patent
Rao et al.

(10) Patent No.: US 8,907,724 B2
(45) Date of Patent: Dec. 9, 2014

(54) VARIABLE GAIN AMPLIFIER

(71) Applicant: Huawei Technologies Co., Ltd., Shenzhen, Guangdong (CN)

(72) Inventors: Jin Rao, Shanghai (CN); Quan Liu, Shanghai (CN); Yun Zhu, Shanghai (CN); Huajiang Wang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 58 days.

(21) Appl. No.: 13/900,319

(22) Filed: May 22, 2013

(65) Prior Publication Data

US 2013/0314157 A1 Nov. 28, 2013

(30) Foreign Application Priority Data

May 22, 2012 (CN) .......................... 2012 1 0159711

(51) Int. Cl.
*H03F 3/45* (2006.01)

(52) U.S. Cl.
USPC ................................ 330/254; 330/9; 330/310

(58) Field of Classification Search
USPC ............................................. 330/254, 9, 310
IPC ......................................................... H03F 3/45
See application file for complete search history.

(56) References Cited

U.S. PATENT DOCUMENTS

| | | | |
|---|---|---|---|
| 6,011,437 A | 1/2000 | Sutardja et al. | |
| 6,684,065 B2 * | 1/2004 | Bult et al. | 455/252.1 |
| 7,126,428 B2 * | 10/2006 | Lin et al. | 330/311 |
| 7,154,335 B2 * | 12/2006 | Elmala et al. | 330/259 |
| 7,352,238 B2 * | 4/2008 | Elwan et al. | 330/86 |
| 7,696,817 B1 * | 4/2010 | Boucher et al. | 330/9 |
| 8,451,052 B2 * | 5/2013 | Gilbert | 330/11 |
| 2004/0263254 A1 | 12/2004 | Tahara et al. | |
| 2009/0212860 A1 * | 8/2009 | Fukuzawa et al. | 330/181 |

FOREIGN PATENT DOCUMENTS

| | | |
|---|---|---|
| CN | 1338644 A | 1/2003 |
| CN | 1578121 A | 2/2005 |

OTHER PUBLICATIONS

Gilbert, "The Multi-tanh Principle: A Tutorial Overview," *IEEE Journal of Solid-State Circuits*, pp. 2-17, vol. 33, No. 1, IEEE (Jan. 1998).

* cited by examiner

*Primary Examiner* — Patricia Nguyen
(74) *Attorney, Agent, or Firm* — Leydig, Voit & Mayer, Ltd.

(57) ABSTRACT

The embodiments of the present invention disclose a variable gain amplifier and relate to the field of electronic circuits. The linear-in-dB relationship between an output current and a control voltage of the variable gain amplifier is relatively ideal. The variable gain amplifier includes a fitted differential module group and an offset voltage output module, where the fitted differential module group is configured to output, under the control of a driving voltage and offset voltages, an output current of the variable gain amplifier according to a reference current; and the fitted differential module group includes n fitted differential modules, the n fitted differential modules are cascaded in turn, and n is any positive integer larger than 1.

6 Claims, 3 Drawing Sheets

VARIABLE GAIN AMPLIFIER

CROSS-REFERENCE TO RELATED APPLICATION

This application claims priority to Chinese Patent Application No. 201210159711.4, filed on May 22, 2012, which is hereby incorporated by reference in its entirety.

FIELD OF THE INVENTION

The present invention relates to the field of electronic circuits, and in particular, to a variable gain amplifier.

BACKGROUND OF THE INVENTION

A variable gain amplifier is widely applied in a communication circuit or an audio/video analog signal processing circuit. Generally, a variable gain amplifier needs to have a variable gain, with its output current in an exponential proportion to its control voltage. When a decibel value is used as a scale, a gain curve is a straight line, generally called a linear-in-dB relationship (Linear-in-dB). In addition, a variable gain amplifier needs to have a large output gain range, a large output dynamic range, low noise, a low voltage, and low power consumption. Performance of a variable gain amplifier directly affects system performance. For a variable gain amplifier, however, there are substantial and high requirements for its indicators, making it rather difficult to design a variable gain amplifier with good performance.

The inventor has found, in the process of implementing the present invention, that a linear-in-dB relationship between an output current and a control voltage of a variable gain amplifier in the prior art is not ideal and cannot well meet a requirement for a variable gain amplifier in practical use.

SUMMARY OF THE INVENTION

To solve the technical issue, the present invention provides a variable gain amplifier, where a linear-in-dB relationship between an output current and a control voltage of the variable gain amplifier is quite ideal.

To resolve the technical issue, a variable gain amplifier in the present invention uses the following technical solutions:

a variable gain amplifier, including a fitted differential module group and an offset voltage output module, where:

the fitted differential module group is configured to output, under the control of a driving voltage and offset voltages, an output current of the variable gain amplifier according to a reference current; the fitted differential module group includes n fitted differential modules, where n is any positive integer larger than 1; and the n fitted differential modules are cascaded in turn and meet the following:

$I_{out}(s-1)=I_{in}(s)$, where s is larger than 1 and smaller than or equal to n, $I_{out}(s-1)$ indicates an output current of an $(s-1)^{th}$ fitted differential module, $I_{in}(s)$ indicates an input current of an $s^{th}$ fitted differential module, an input current $I_{in}(1)$ of a first fitted differential module of the fitted differential module group is the reference current, and an output current of an $n^{th}$ fitted differential module of the fitted differential module group is the output current of the variable gain amplifier; and the offset voltage output module is configured to input the offset voltages, which meet $V_2-V_1= \ldots =V_s-V_{s-1}= \ldots V_n-V_{n-1}$, to the multiple fitted differential modules, respectively, where $V_s$ indicates an offset voltage that the offset voltage output module inputs to the $s^{th}$ fitted differential module.

In the technical solutions according to the embodiments of the present invention, the variable gain amplifier includes a fitted differential module group and an offset voltage output module; the fitted differential module group is configured to output, under the control of a driving voltage and offset voltages, an output current of the variable gain amplifier according to a reference current; the fitted differential module group includes n fitted differential modules, where n is any positive integer larger than 1; the n fitted differential modules are cascaded in turn and meet $I_{out}(s-1)=I_{in}(s)$, where s is larger than 1 and smaller than or equal to n, $I_{out}(s-1)$ indicates an output current of an $(s-1)^{th}$ fitted differential module, $I_{in}(s)$ indicates an input current of an $s^{th}$ fitted differential module, an input current $I_{in}(1)$ of a first fitted differential module of the fitted differential module group is the reference current, and an output current of an $n^{th}$ fitted differential module of the fitted differential module group is the output current of the variable gain amplifier; and the offset voltage output module is configured to input the offset voltages, which meet $V_2-V_1= \ldots =V_s-V_{s-1} \ldots =V_n-V_{n-1}$, to the multiple fitted differential modules, respectively, where $V_s$ indicates an offset voltage that the offset voltage output module inputs to the $s^{th}$ fitted differential module. When the variable gain amplifier is working, the offset voltage output module delivers corresponding offset voltages to the fitted differential modules, so that the cascaded fitted differential modules output, under the effect of their respective offset voltages, an output current that is in a relatively ideal linear-in-dB relationship with a control voltage.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following descriptions show merely some embodiments of the present invention, and persons of ordinary skill in the art may still derive other drawings from these accompanying drawings without creative efforts.

DETAILED DESCRIPTION OF THE EMBODIMENTS

The following clearly describes the technical solutions in the embodiments of the present invention with reference to the accompanying drawings in the embodiments of the present invention. Apparently, the embodiments to be described are merely a part rather than all of the embodiments of the present invention. All other embodiments obtained by persons of ordinary skill in the art based on the embodiments of the present invention without creative efforts shall fall within the protection scope of the present invention.

Figure 1:
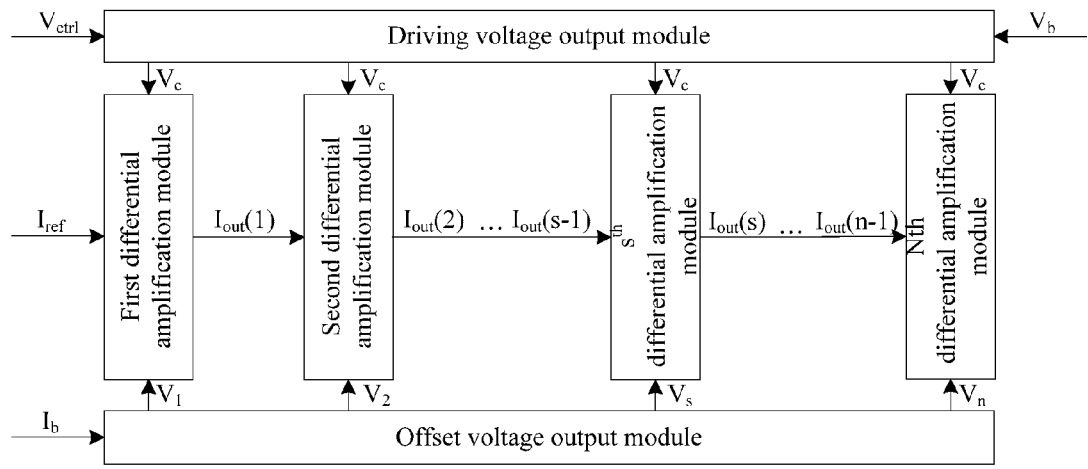
FIG. 1 is a schematic structural diagram of a variable gain amplifier according to an embodiment of the present invention.

An embodiment of the present invention provides a variable gain amplifier. As shown in FIG. 1, four input ends are arranged for the variable gain amplifier and are an input end of a control voltage $V_{ctrl}$, an input end of a reference current $I_{ref}$, an input end of a band-gap current $I_b$, and an input end of a band-gap voltage $V_b$, respectively.

Specifically, as shown in FIG. 1, the variable gain amplifier includes a fitted differential module group and an offset voltage output module, where:

the fitted differential module group is configured to output, under the control of a driving voltage and offset voltages, an output current of the variable gain amplifier according to a reference current; the fitted differential module group includes n fitted differential modules, where n is any positive integer larger than 1; and the n fitted differential modules are cascaded in turn and meet the following:

$I_{out}(s-1)=I_{in}(s)$, where s is larger than 1 and smaller than or equal to n, $I_{out}(s-1)$ indicates an output current of an $(s-1)^{th}$ fitted differential module, $I_{in}(s)$ indicates an input current of an $s^{th}$ fitted differential module, an input current $I_{in}(1)$ of a first fitted differential module of the fitted differential module group is the reference current, and an output current of an $n^{th}$ fitted differential module of the fitted differential module group is the output current of the variable gain amplifier; and the offset voltage output module is configured to input the offset voltages, which meet $V_2-V_1=\ldots=V_s-V_{s-1}\ldots=V_n-V_{n-1}$, to the multiple fitted differential modules, respectively, where $V_s$ indicates an offset voltage that the offset voltage output module inputs to the $s^{th}$ fitted differential module.

Figure 2:
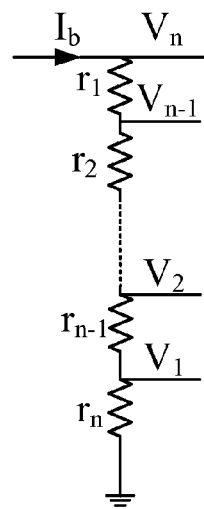
FIG. 2 is a schematic structural diagram of a fitted differential module according to an embodiment of the present invention.

In the embodiment of the present invention, the specific structure of the offset voltage output module may be shown in FIG. 2, n serially connected resistors are arranged in the offset voltage output module, and the n resistors are $r_1, r_2, \ldots$, and $r_n$, respectively, where $r_1=r_2=\ldots=r_{n-1}$. One band-gap current $I_b$, which flows from outside the variable gain amplifier, passes through the resistors. Except for the grounding end of the $r_n$ an end of each resistor is an offset voltage output end of the offset voltage output module; therefore, together n offset voltage output ends are arranged for the offset voltage output module and output offset voltages $V_1, V_2, \ldots$, and $V_n$, respectively. In the offset voltage output module according to the embodiment of the present invention, $V_2-V_1=\ldots=V_s-V_{s-1}\ldots=V_n-V_{n-1}=I_b\times r_1$ because $r_1=r_2=\ldots=r_{n-1}$. For ease of description, a product of multiplying the band-gap current $I_b$ and the $r_1$ may be named as $V_r$.

As shown in FIG. 1, the variable gain amplifier further includes:

a driving voltage output module, where the driving voltage output module has n driving voltage output ends, and the n driving voltage output ends are connected to the n fitted differential modules, respectively, and are configured to output the driving voltages $V_c$, which are in proportion to the control voltage of the variable gain amplifier, to fitted differential submodules of the n fitted differential modules.

Figure 3:
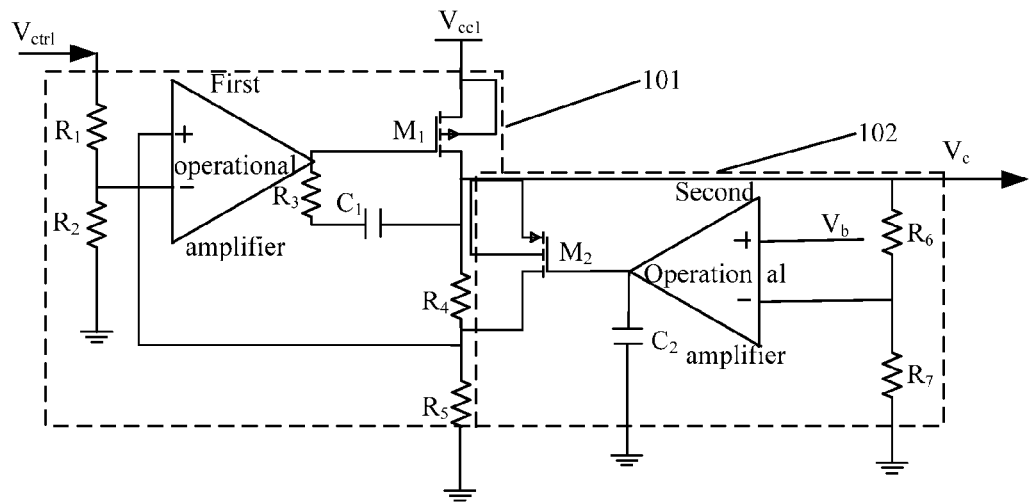
FIG. 3 is a schematic structural diagram of a driving voltage output module according to an embodiment of the present invention.

As shown in FIG. 3, the driving voltage output module includes a first driving voltage output submodule 101 and a second driving voltage output submodule 102, where the first driving voltage output submodule 101 or the second driving voltage output submodule 102 outputs the driving voltage $V_c$ to the fitted differential submodules of the n fitted differential modules.

Specifically, as shown in FIG. 3, the first driving voltage output submodule 101 includes a first resistor $R_1$, a second resistor $R_2$, a first operational amplifier, a third resistor $R_5$, a first capacitor $C_1$, a fourth resistor $R_4$, a fifth resistor $R_5$, and a first field effect transistor $M_1$, where:

one end of the first resistor $R_1$ is connected to the input end of the control voltage $V_{ctrl}$ of the variable gain amplifier, and the other end of the first resistor $R_1$ is connected to one end of the second resistor $R_2$;

one end of the second resistor $R_2$ is connected to an inverting input end of the first operational amplifier, where the one end of the second resistor $R_2$ is connected to the first resistor $R_1$; and the other end of the second resistor $R_2$ is grounded;

a non-inverting input end of the first operational amplifier is connected to one end of the fifth resistor $R_5$ and is grounded through the fifth resistor $R_5$; the inverting input end of the first operational amplifier is connected to an end of the second resistor $R_2$; an output end of the first operational amplifier is connected to both the gate electrode of the first field effect transistor $M_1$ and the third resistor $R_3$; and the output end of the first operational amplifier is connected to the first capacitor $C_1$ through the third resistor $R_3$;

one end of the first capacitor $C_1$ is connected to one end of the third resistor $R_3$, and the other end of the first capacitor $C_1$ is connected to both the drain electrode of the first field effect transistor and output ends of the driving voltage $V_c$; and the gate electrode of the first field effect transistor $M_1$ is connected to the output end of the first operational amplifier; the source electrode and the substrate of the first field effect transistor $M_1$ are connected to a high level; and the drain electrode of the first field effect transistor $M_1$ is connected to output ends of the driving voltage $V_c$, and is also grounded through the fifth resistor $R_5$ and the fourth resistor $R_4$.

In addition, as shown in FIG. 3, the second driving voltage output submodule 102 includes a second field effect transistor $M_2$, a second capacitor $C_2$, a second operational amplifier, a sixth resistor $R_6$, and a seventh resistor $R_7$, where:

the source electrode and the substrate of the second field effect transistor $M_2$ are connected to the drain electrode of the first field effect transistor $M_1$ and output ends of the driving voltage $V_c$; the gate electrode of the second field effect transistor $M_2$ is connected to an output end of the second operational amplifier; and the drain electrode of the second field effect transistor $M_2$ is connected to the non-inverting input end of the first operational amplifier;

one end of the second capacitor $C_2$ is connected to both the output end of the second operational amplifier and the gate electrode of the second field effect transistor $M_2$, and the other end of the second capacitor $C_2$ is grounded; and a non-inverting input end of the second operational amplifier is connected to the input end of the band-gap voltage $V_b$ of the variable gain amplifier, and an inverting input end of the second operational amplifier is grounded through the seventh resistor $R_7$, and also connected to output ends of the driving voltage $V_c$ through the sixth resistor $R_6$.

The specific working process of the driving voltage output module is as follows:

In the first driving voltage output submodule 101, the first field effect transistor $M_1$ is conducted under the effect of a high level $V_{cc}$, where a value of the high level $V_{cc}$ may be selected according to an actual requirement as long as the value of the high level $V_{cc}$ can make the $M_1$ conducted. Generally, the value of the high level $V_{cc}$ is 5 volts by default unless otherwise stated. The value of the high level $V_{cc}$ is stable and does not change; therefore, the high level $V_{cc}$ may be provided by a built-in voltage source of the variable gain amplifier.

In the second driving voltage output submodule 102, the second field effect transistor $M_2$ is controlled by the driving voltage $V_c$ that is output by the driving voltage output module. Generally, when the $V_c$ is set to a value larger than or equal to a value of the driving voltage $V_c$ required for the fitted differential modules to work normally, the $M_2$ is conducted. In this case, the first driving voltage output submodule cannot work normally, and the second driving voltage output submodule 102 outputs the driving voltage $V_c$ with a specific value to the fitted differential submodules, where the $V_c$ is related to a band-gap voltage $V_b$ that the variable gain amplifier internally supplies to the second operational amplifier.

Specifically:

When the $M_1$ is conducted but the $M_2$ is not conducted, the first operational amplifier and the fourth resistor $R_4$ form a closed loop, where the inverting input end of the first operational amplifier is connected to one end of the first resistor $R_1$; a voltage that is input into the inverting input end of the first operational amplifier is $V_{ctrl} \times R_2/(R_1+R_2)$; the non-inverting input end of the first operational amplifier is connected to one end of the fourth resistor $R_4$; and a voltage that is input into the non-inverting input end of the first operational amplifier is $V_c \times R_5/(R_4+R_5)$. The closed loop that is formed by the first operational amplifier and the fourth resistor $R_4$ works in linear state, so $V_{ctrl} \times R_2/(R_1+R_2) = V_c \times R_5/(R_4+R_5)$, and then $V_c = V_{ctrl} \times [R_2/(R_1+R_2)] \times [(R_4+R_5)/R_5]$ (1).

When the $V_{ctrl}$ is excessively large, and as a result, the value of the $V_c$ is larger than or equal to a maximum value of the driving voltage $V_c$ that the fitted differential modules working normally can tolerate, the $M_2$ is conducted, the $R_4$ is approximately shorted by the $M_2$, and Equation (1) does not hold. In addition, a stable band-gap voltage $V_b$ is input into the non-inverting input end of the second operational amplifier, a voltage that is input into the inverting input end is $V_c \times R_7/(R_6+R_7)$, and at this time, a closed loop that is formed by the second operational amplifier, the $R_6$, and the $M_2$ works in linear state; therefore, $V_c \times R_7/(R_6+R_7) = V_b$, then $V_c = V_b \times (R_6+R_7)/R_7$, and in this case, the value of the $V_c$ is independent of an actually-input value of the $V_{ctrl}$. The value of the driving voltage $V_c$ is fixed because $V_c = V_b \times (R_6+R_7)/R_7$ and values of the band-gap voltage $V_b$, the sixth resistor $R_6$, and the seventh resistor $R_7$ are constant. Generally, the value of the $V_c$ may be invariably set to the maximum value of the driving voltage $V_c$ that the fitted differential modules working normally can tolerate, so as to ensure that the second field effect transistor $M_2$ is conducted and the fitted differential modules work normally.

It should be noted that, in the process of practical use, the probability that the $V_{ctrl}$ is excessively large is relatively low, and therefore, the driving voltage $V_c$ meets the equation $V_c = V_{ctrl} \times [R_2/(R_1+R_2)] \times [(R_4+R_5)/R_5]$ by default in the following.

In addition, as can be seen from FIG. 3, a capacitor is set in both the first driving voltage output submodule 101 and the second driving voltage output submodule 102. The first driving voltage output submodule 101 includes the first capacitor $C_1$, and the second driving voltage output submodule includes the second capacitor $C_2$. The first capacitor $C_1$ performs phase compensation for the voltage that is output by the first operational amplifier, and ensures stability of the voltage that is output by the first operational amplifier; and the second capacitor $C_2$ performs phase compensation for the voltage that is output by the second operational amplifier, and ensures stability of the voltage that is output by the second operational amplifier.

As shown in FIG. 1, the variable gain amplifier further includes a fitted differential module group, where:

the fitted differential module group is configured to output, under the control of a driving voltage and offset voltages, an output current of the variable gain amplifier according to a reference current; the fitted differential module group includes n fitted differential modules, where n is any positive integer larger than 1; and the n fitted differential modules are cascaded in turn and meet the following:

$I_{out}(s-1) = I_{in}(s)$, where s is larger than 1 and smaller than or equal to n, $I_{out}(s-1)$ indicates an output current of an $(s-1)^{th}$ fitted differential module, $I_{in}(s)$ indicates an input current of an $s^{th}$ fitted differential module, an input current $I_{in}(1)$ of a first fitted differential module of the fitted differential module group is the reference current, and an output current of an $n^{th}$ fitted differential module of the fitted differential module group is the output current $I_{out}$ of the variable gain amplifier; and the output current $I_{out}$ of the variable gain amplifier is in a relatively ideal linear-in-dB relationship with the input control voltage $V_{ctrl}$ of the variable gain amplifier.

It should be noted that the number of cascaded fitted differential modules in the embodiment of the present invention may be selected according to an actual situation. Generally, six or seven fitted differential modules are selected and cascaded to achieve a relatively ideal linear-in-dB relationship between an output current of a last fitted differential module and the input control voltage $V_{ctrl}$ of the variable gain amplifier. In addition, all the multiple fitted differential modules in the embodiment of the present invention have the same feature circuit with the same function.

Figure 4:
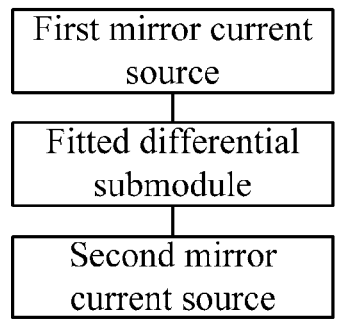
FIG. 4 is a schematic structural diagram of an offset voltage output module according to an embodiment of the present invention.

Further, as shown in FIG. 4, any one of the n fitted differential modules includes:

a first mirror current source, configured to receive an input current of the fitted differential module and output a stable first bias current to a fitted differential submodule of the fitted differential module, where the first bias current is in a multiple relationship with the input current of the fitted differential module, and an output end of the first mirror current source is connected to a current input end of the fitted differential submodule;

a fitted differential submodule, configured to enlarge an area in which a linear-in-dB relationship exists between an input current of the fitted differential submodule and the control voltage of the variable gain amplifier, where an output end of the fitted differential submodule is connected to an input end of a second mirror current source; and a second mirror current source, configured to receive an output current of the fitted differential submodule and output a stable second bias current, where the second bias current is in a multiple relationship with the output current of the fitted differential submodule; and when the fitted differential module is not an $n^{th}$ fitted differential module, an output end of the second mirror current source of the fitted differential module is connected to a current input end of a next-level fitted differential module; when the fitted differential module is the $n^{th}$ fitted differential module, the output end of the second mirror current source of the fitted differential module is a current output end of the variable gain amplifier.

Figure 5:
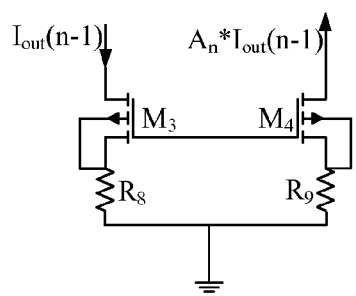
FIG. 5 is a schematic structural diagram of a first mirror current source of a fitted differential module according to an embodiment of the present invention.

Further, as shown in FIG. 5, the structure of the first mirror current source of the fitted differential module is specifically as follows (by taking the $n^{th}$ fitted differential module as an example; the first mirror current source of each of the rest fitted differential modules has the same feature circuit as the first mirror current source of the $n^{th}$ fitted differential module):

the gate electrode of a third field effect transistor $M_3$ is connected to the gate electrode of a fourth field effect transistor $M_4$; one end of an eighth resistor $R_8$ is connected to the drain electrode of the $M_3$, and the other end of the $R_8$ is grounded; and one end of a ninth resistor $R_9$ is connected to the drain electrode of the $M_4$, and the other end of the $R_9$ is grounded.

As shown in FIG. 5, the first mirror current source of the $n^{th}$ fitted differential module receives an output current $I_{out}(n-1)$ that comes from a preceding fitted differential module, that is, a $(n-1)^{th}$ fitted differential module, where the output current $I_{out}(n-1)$ is used as an input current. The $I_{out}(n-1)$ flows into the source electrode of the $M_3$ of the $n^{th}$ fitted differential module. Then, under the effect of the first mirror current source, a current is output from the source electrode of the $M_4$, and the current is a first bias current. The $M_3$ and the $M_4$ are the same type of N-channel insulated gate field effect transistors whose width-to-length ratio is $A_n$, and the $R_8$ and the $R_9$ are the same type of resistors and the ratio of the resistance of the $R_8$ to the resistance of the $R_9$ is $A_n$; therefore, when a current that flows into the source electrode of the $M_3$ is $I_{out}(n-1)$, the first bias current that flows out of the source electrode of the $M_4$ is $A_n \times I_{out}(n-1)$, where $A_n$ is generally an integer. When $A_n$ is larger than 1, it is equivalent to that the first mirror current source amplifies the input $I_{out}(n-1)$.

It should be noted that a value of $A_n$ described above may be selected according to an actual situation. When the first mirror current source is not required to amplify its input current, the value of $A_n$ is generally 1. That is, the $M_3$ and the $M_4$ are the same N-channel insulated gate field effect transistors in this case; and a different value may be set for $A_n$ of each fitted differential module according to an actual situation, and generally, the value of $A_n$ may be 1.

In addition, when the fitted differential module is the first fitted differential module, the source electrode of the $M_3$ of the first mirror current source of the first fitted differential module is connected to the input end of the reference current $I_{ref}$ of the variable gain amplifier; therefore, an input current of the first mirror current source of the first fitted differential module is a reference current $I_{ref}$ that is delivered from outside to the variable gain amplifier.

Figure 6:
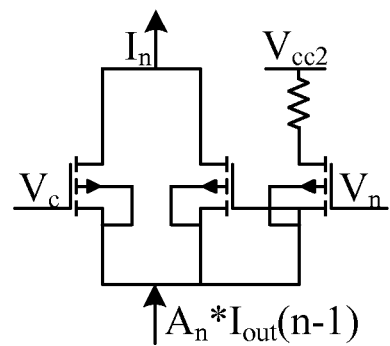
FIG. 6 is a schematic structural diagram 1 of a fitted differential submodule of a fitted differential module according to an embodiment of the present invention.

An input current end of a fitted differential submodule of the $n^{th}$ fitted differential module is connected to an output current end of the first mirror current source of the $n^{th}$ fitted differential module. Then, after the current $I_{out}(n-1)$ that comes from the $(n-1)^{th}$ fitted differential module experiences the effect of the first mirror current source of the $n^{th}$ fitted differential module, the $A_n \times I_{out}(n-1)$ flows into the fitted differential submodule of the $n^{th}$ fitted differential module, where the fitted differential submodule is configured to enlarge an area in which a linear-in-dB relationship exists between the input current $A_n \times I_{out}(n-1)$ of the fitted differential submodule and the control voltage $V_{ctrl}$ of the variable gain amplifier. FIG. 6 shows the structure of the fitted differential submodule. Three field effect transistors in the fitted differential submodule are field effect transistors that have same parameters. A driving voltage $V_c$ that is in proportion to the control voltage $V_{ctrl}$ is input into the gate electrode of one field effect transistor, and an offset voltage $V_n$ is input into the gate electrodes of the other two field effect transistors. In addition, the source electrode of one field effect transistor, into the gate electrode of which the offset voltage $V_n$ is input, is connected to a certain high level $V_{cc2}$, where the high level $V_{cc2}$ acts on an input end of the $A_n \times I_{out}(n-1)$ of the fitted differential submodule through the field effect transistor to which the high level $V_{cc2}$ is connected, so that a voltage at the input end of the $A_n \times I_{out}(n-1)$ of the fitted differential submodule is approximate to and slightly smaller than $V_{cc2}$. As can be seen from FIG. 6, the $A_n \times I_{out}(n-1)$ is input into the drain electrodes of two field effect transistors, into the gate electrodes of which the driving voltage $V_c$ and the offset voltage $V_n$ are input respectively. Under the effect of both the driving voltage $V_c$ and the offset voltage $V_n$, the source electrodes of the two field effect transistors, into the gate electrodes of which the driving voltage $V_c$ and the offset voltage $V_n$ are input respectively, output a current $I_n$, where $I_n = A_n \times I_{out}(n-1) \times e^{\tan h(x)}$, $x = (V_c - V_n)/V_t$, and $V_t$ is a thermal voltage of the field effect transistors of the fitted differential submodule.

Further, $e^{\tan h(x)} \approx b + a \times \tan h(x)$, where parameters b and a are constants introduced to improve fitting accuracy of left and right sides of the approximate equality sign; therefore, $$I_n \approx A_n \times I_{out}(n-1) \times \left[ b + a \times \tanh\left(\frac{V_c - V_n}{V_t}\right) \right],$$

where $V_n = V_1 + (n-1) \times V_r$.

Figure 8:
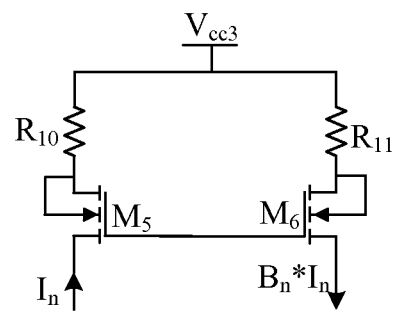
FIG. 8 is a schematic structural diagram of a second mirror current source of a fitted differential module according to an embodiment of the present invention.

The output current $I_n$ of the fitted differential submodule of the $n^{th}$ fitted differential module flows into the second mirror current source of the $n^{th}$ fitted differential module. FIG. 8 shows the structure of the second mirror current source. The gate electrode of a fifth field effect transistor $M_5$ of the second mirror current source is connected to the gate electrode of a sixth field effect transistor $M_6$. One end of a tenth resistor $R_{10}$ is connected to the source electrode of the $M_5$, and the other end of the $R_{10}$ is connected to a high level $V_{cc3}$; and one end of an eleventh resistor $R_{11}$ is connected to the source electrode of the $M_6$, and the other end of the $R_{11}$ is connected to the high level $V_{cc3}$.

The output current of the fitted differential submodule of the $n^{th}$ fitted differential module flows into the drain electrode of the $M_5$ of the second mirror current source of the $n^{th}$ fitted differential module. The $M_5$ and the $M_6$ are the same type of P-channel insulated gate field effect transistors whose width-to-length ratio is $B_n$, and the $R_{10}$ and the $R_{11}$ are the same type of resistors and the ratio of the resistance of the $R_{10}$ to the resistance of the $R_{11}$ is $B_n$; therefore, when a current that flows into the drain electrode of the $M_5$ is $I_n$, a current that flows out of the drain electrode of the $M_6$ is $B_n \times I_n$. Therefore, the second bias current $B_n \times I_n$ that is output by the second mirror current source of the $n^{th}$ fitted differential module satisfies a multiple $B_n$ relationship with the output current $I_n$ of the fitted differential submodule. Generally, $B_n$ is an integer. When $B_n$ is larger than 1, it is equivalent to that the second mirror current source amplifies the input $I_n$.

It should be noted that a value of $B_n$ described above may be selected according to an actual situation. When the second mirror current source is not required to amplify its input current, the value of $B_n$ is generally 1. That is, in this case, the $M_5$ and the $M_6$ are same N-channel insulated gate field effect transistors; and a different value may be set for $B_n$ of each fitted differential module, and generally, the value of $B_n$ may be 1.

It should be noted that the $I_n$ is a current that is output by the source electrodes of two field effect transistors, into the gate electrodes of which a driving voltage $V_c$ and an offset voltage $V_n$ are input respectively; and a voltage at the source electrodes of the two field effect transistors is approximately $V_{cc2}$. As mentioned above, in a variable gain amplifier according to the embodiment of the present invention, multiple fitted differential modules are cascaded so that the current output by the last fitted differential module is in a relatively ideal linear-in-dB relationship with the control voltage $V_{ctrl}$. In addition, as can be seen from FIG. 6 and the analysis in the preceding paragraph, an output current $I_{out}(s)$ of a fitted differential submodule of each fitted differential module is output from the source electrode of a field effect transistor. According to fundamental knowledge about a field effect transistor, when a field effect transistor is working normally, a voltage of its source electrode is slightly higher than a voltage of its drain electrode. If a fitted differential submodule of a next-level fitted differential module is directly connected at an output end of a fitted differential submodule, an output voltage of a high level inside the fitted differential submodule of the next-level fitted differential module needs to be raised, so that the fitted differential submodule of the next-level fitted differential module can work normally. If multiple fitted differential submodules are directly cascaded without using any means, this means that output voltages of high levels inside the multiple fitted differential submodules need to be set and that a voltage value that is output by a high level inside each-level fitted differential submodule needs to be higher than a voltage value that is output by a high level inside a preceding-level fitted differential submodule. This makes it even more complex to implement a variable gain amplifier of the embodiment of the present invention.

To solve this problem, the usual means in the prior art is to connect a mirror current source, namely, the first mirror current source according to the embodiment of the present invention, at the current input end of the fitted differential submodule of the fitted differential module, and to connect a mirror current source, namely, the second mirror current source according to the embodiment of the present invention, at the current output end of the fitted differential submodule. The first mirror current source and the second mirror current source not only may amplify and stabilize the value of a current in the fitted differential module, but also may adjust, by using various resistors in the first mirror current source and the second mirror current source, the value of a voltage of a node which a current passes through. This reduces the associated voltage of the current $I_{out}(s)$ that is output by the fitted differential submodule, so that voltage values output by high levels of various fitted differential submodules may be unified to facilitate implementation of the variable gain amplifier.

Figure 7:
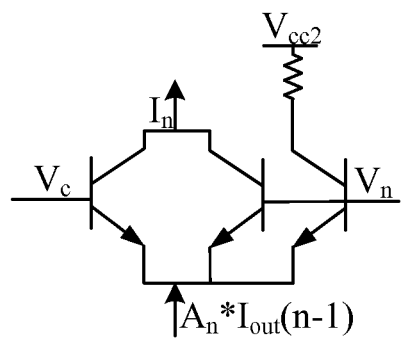
FIG. 7 is a schematic structural diagram 2 of a fitted differential submodule of a fitted differential module according to an embodiment of the present invention.

Further, the structure of the fitted differential submodule may further be shown in FIG. 7. That is, field effect transistors that have same parameters as shown in FIG. 6 are replaced with semiconductor triodes that have same parameters.

The output current of the second mirror current source of the $n^{th}$ fitted differential module, that is, the second bias current, is the output current $I_{out}$ of the variable gain amplifier. That is, $$I_{out} = B_n \times I_n \approx A_n \times B_n \times \left[b + a \times \tanh\left(\frac{V_c - V_n}{V_t}\right)\right].$$

Because n fitted differential modules are cascaded and $V_n = V_1 + (n-1)*V_r$, the following holds:

$$I_{out} \approx I_{ref} \times \left[A_1 \times B_1 \times (b+a) \times \tanh\left(\frac{V_c - V_1}{V_t}\right)\right] \times$$
$$\left[A_2 \times B_2 \times (b+a) \times \tanh\left(\frac{V_c - V_1 - V_r}{V_t}\right)\right] \times \ldots \times$$
$$\left\{A_n \times B_n \times (b+a) \times \tanh\left[\frac{V_c - V_1 - (n-1) \times V_r}{V_t}\right]\right\}$$

where, $I_{ref}$ is a bias current that is input into the variable gain amplifier and has a temperature characteristic.

Further, because $e^{\tan h(x)} \approx b + a \times \tan h(x)$, the following holds:

$$I_{out} \approx \prod_{i=1}^{n} (A_i \times B_i) \times I_{ref} \times e^{\sum_{j=0}^{n-1} \tanh\left(\frac{V_c - V_1 - j \times V_r}{V_t}\right)}$$

The driving voltage $V_c$ is in a linear relationship with the control voltage $V_{ctrl}$; therefore, as can be seen from the preceding formula, the ultimate output current $I_{out}$ of the variable gain amplifier is in a linear-in-dB relationship with the control voltage $V_{ctrl}$.

In the technical solutions according to the embodiments of the present invention, the variable gain amplifier includes a fitted differential module group and an offset voltage output module; the fitted differential module group is configured to output, under the control of a driving voltage and offset voltages, an output current of the variable gain amplifier according to a reference current; the fitted differential module group includes n fitted differential modules, where n is any positive integer larger than 1; the n fitted differential modules are cascaded in turn and meet $I_{out}(s-1)=I_{in}(s)$, where s is larger than 1 and smaller than or equal to n, $I_{out}(s-1)$ indicates an output current of an $(s-1)^{th}$ fitted differential module, $I_{in}(s)$ indicates an input current of an $s^{th}$ fitted differential module, an input current $I_{in}(1)$ of a first fitted differential module of the fitted differential module group is the reference current, and an output current of an $n^{th}$ fitted differential module of the fitted differential module group is the output current of the variable gain amplifier; and the offset voltage output module is configured to input the offset voltages, which meet $V_2 - V_1 = \ldots = V_s - V_{s-1} = V_n - V_{n-1}$, to the multiple fitted differential modules, respectively, where $V_s$ indicates an offset voltage that the offset voltage output module inputs to the $s^{th}$ fitted differential module. When the variable gain amplifier is working, the offset voltage output module delivers corresponding offset voltages to the fitted differential modules, so that the cascaded fitted differential modules output, under the effect of their respective offset voltages, an output current that is in a relatively ideal linear-in-dB relationship with a control voltage.

The foregoing description is merely about the specific implementation of the present invention, but is not intended to limit the protection scope of the present invention. Any variation or replacement readily figured out by persons skilled in the art within the technical scope of the present invention shall fall within the protection scope of the present invention. Therefore, the protection scope of the present invention shall be subject to the protection scope of the claims.

What is claimed is:

1. A variable gain amplifier, comprising a fitted differential module group and an offset voltage output module, wherein:
    the fitted differential module group is configured to output, under control of a driving voltage and offset voltages, an output current of the variable gain amplifier according to a reference current; the fitted differential module group includes a number n fitted differential modules, and the number n is any positive integer larger than 1; and the n fitted differential modules are cascaded in turn and meet the following:

$I_{out}(s-1)=I_{in}(s)$, wherein s is larger than 1 and smaller than or equal to the number n, $I_{out}(s-1)$ indicates an output current of an $(s-1)^{th}$ fitted differential module, $I_{in}(s)$ indicates an input current of an $s^{th}$ fitted differential module, an input current $I_{in}(1)$ of a first fitted differential module of the fitted differential module group is the reference current, and an output current of an $n^{th}$ fitted differential module of the fitted differential module group is the output current of the variable gain amplifier; and the offset voltage output module is configured to input the offset voltages, to the multiple fitted differential modules, respectively, wherein the offset voltages meet:

$$V_2-V_1=\ldots=V_s-V_{s-1}\ldots=V_n-V_{n-1},$$

wherein $V_s$ indicates an offset voltage that the offset voltage output module inputs to the $s^{th}$ fitted differential module.

2. The variable gain amplifier according to claim 1, wherein:

each fitted differential module of the fitted differential module group comprises:

a first mirror current source, configured to receive an input current of a fitted differential module and output a stable first bias current to a fitted differential submodule of the fitted differential module, wherein the first bias current is in a multiple relationship with the input current of the fitted differential module, and an output end of the first mirror current source is connected to a current input end of the fitted differential submodule;

the fitted differential submodule, configured to enlarge an area in which a linear-in-dB relationship exists between an input current of the fitted differential submodule and a control voltage of the variable gain amplifier, wherein an output end of the fitted differential submodule is connected to an input end of a second mirror current source; and the second mirror current source, configured to receive an output current of the fitted differential submodule and output a stable second bias current, wherein the second bias current is in a multiple relationship with the output current of the fitted differential submodule; and when the fitted differential module is not the $n^{th}$ fitted differential module, an output end of the second mirror current source of the fitted differential module is connected to a current input end of a next-level fitted differential module; when the fitted differential module is the $n^{th}$ fitted differential module, the output end of the second mirror current source of the fitted differential module is a current output end of the variable gain amplifier.

3. The variable gain amplifier according to claim 2, further comprising:

a driving voltage output module, wherein the driving voltage output module has n driving voltage output ends, and the n driving voltage output ends are connected to fitted differential submodules of the n fitted differential modules, respectively, and configured to output a driving voltage, which is in proportion to the control voltage of the variable gain amplifier, to the fitted differential submodules of the n fitted differential modules.

4. The variable gain amplifier according to claim 3, wherein the driving voltage output module comprises:

a first driving voltage output submodule and a second driving voltage output submodule, wherein the first driving voltage output submodule or the second driving voltage output submodule outputs the driving voltage, which is in proportion to the control voltage of the variable gain amplifier, to the fitted differential submodules of the n fitted differential modules.

5. The variable gain amplifier according to claim 4, wherein the first driving voltage output submodule comprises a first resistor, a second resistor, a first operational amplifier, a third resistor, a first capacitor, a fourth resistor, a fifth resistor, and a first field effect transistor;

one end of the first resistor is connected to an input end of the control voltage of the variable gain amplifier, and the other end of the first resistor is connected to a first end of the second resistor;

a second end of the second resistor is connected to an inverting input end of the first operational amplifier, wherein the first end of the second resistor is connected to the first resistor; and a third end of the second resistor is grounded;

a non-inverting input end of the first operational amplifier is connected to one end of the fifth resistor and is grounded through the fifth resistor; an inverting input end of the first operational amplifier is connected to the second end of the second resistor; an output end of the first operational amplifier is connected to both the gate electrodes of the first field effect transistor and the third resistor; and the output end of the first operational amplifier is connected to the first capacitor through the third resistor;

one end of the first capacitor is connected to one end of the third resistor, and the other end of the first capacitor is connected to both drain electrodes of the first field effect transistor and output ends of the driving voltage;

one end of the fourth resistor is connected to input ends of the driving voltage of the fitted differential submodules of the n fitted differential modules, and the other end of the fourth resistor is connected to the one end of the fifth resistor;

the one end of the fifth resistor is connected to both the non-inverting input end of the first operational amplifier and one end of the fourth resistor, and the other end of the fifth resistor is grounded; and the gate electrode of the first field effect transistor is connected to the output end of the first operational amplifier; a source electrode and a substrate of the first field effect transistor are connected to a voltage source; and the drain electrode of the first field effect transistor is connected to the output ends of the driving voltage, and is also grounded through the fifth resistor and the fourth resistor.

6. The variable gain amplifier according to claim 5, wherein the second driving voltage output submodule comprise a second field effect transistor, a second capacitor, a second operational amplifier, a sixth resistor, and a seventh resistor, wherein:

a source electrode and a substrate of the second field effect transistor are connected to the drain electrode of the first field effect transistor and output ends of the driving voltage; the gate electrode of the second field effect transistor is connected to an output end of the second operational amplifier; and the drain electrode of the second field effect transistor is connected to the non-inverting input end of the first operational amplifier;

one end of the second capacitor is connected to both the output end of the second operational amplifier and the gate electrode of the second field effect transistor, and the other end of the second capacitor is grounded; and a non-inverting input end of the second operational amplifier is connected to an input end of a band-gap voltage of the variable gain amplifier, and an inverting input end of the second operational amplifier is grounded through the seventh resistor, and is also connected to the output ends of the driving voltage through the sixth resistor.

* * * * *